United States Patent [19]

Akashi et al.

[11] Patent Number: 4,543,275
[45] Date of Patent: Sep. 24, 1985

[54] METHOD OF FORMING THIN VAPOR DEPOSITED FILM OF ORGANIC MATERIAL

[75] Inventors: Goro Akashi; Akira Nahara; Yoshihiro Arai, all of Kanagawa, Japan

[73] Assignee: Fuji Photo Film Co., Ltd., Kanagawa, Japan

[21] Appl. No.: 532,817

[22] Filed: Sep. 16, 1983

Related U.S. Application Data

[63] Continuation of Ser. No. 349,408, Feb. 16, 1982, abandoned.

[30] Foreign Application Priority Data

Feb. 16, 1981 [JP] Japan ................................. 56-21651

[51] Int. Cl.[4] ...................... C23C 11/00; C23C 13/00
[52] U.S. Cl. ...................................... 427/250; 427/35; 427/38; 427/39; 427/50; 427/54.1; 427/255.5; 427/255.6; 427/255.7
[58] Field of Search .................. 427/255.6, 255.5, 250, 427/251, 404, 407.1, 295, 294, 296, 50, 39, 52, 45.1, 54.1, 35, 38

[56] References Cited

U.S. PATENT DOCUMENTS

| | | | |
|---|---|---|---|
| 3,296,011 | 1/1967 | McBride et al. | 427/255.6 |
| 3,362,848 | 1/1968 | Hamilton | 427/255.5 |
| 3,379,803 | 4/1968 | Tittmann et al. | 427/255.5 |
| 3,547,683 | 12/1970 | Williams et al. | 427/255.5 |
| 4,325,986 | 4/1982 | Baron et al. | 427/255.5 |

FOREIGN PATENT DOCUMENTS

| | | | |
|---|---|---|---|
| 2009080 | 9/1970 | Fed. Rep. of Germany | 427/255.6 |
| 2706392 | 8/1977 | Fed. Rep. of Germany | 427/255.6 |
| 2624700 | 12/1977 | Fed. Rep. of Germany | 427/255.5 |
| 39-17440 | 8/1964 | Japan . | |
| 49-45989 | 12/1974 | Japan . | |
| 51-20356 | 6/1976 | Japan | 427/255.5 |
| 53-21907 | 7/1978 | Japan . | |

Primary Examiner—S. L. Childs
Attorney, Agent, or Firm—Sughrue, Mion, Zinn, Macpeak & Seas

[57] ABSTRACT

A process for forming a vapor-deposited thin layer of organic material is disclosed. The process involves placing organic material on a support base within a vacuum chamber and providing a heat source in the vicinity of the organic material. A second support base is then provided within the vacuum chamber and heat is applied to the organic material at a temperature which causes the organic material to form vapors. The vapors are vapor-deposited on the second support base forming the thin layer of organic material. It is generally desirable to move both of the support bases during the vapor deposition process allowing the formation of a continuous uniform thin layer of organic material.

6 Claims, 3 Drawing Figures

METHOD OF FORMING THIN VAPOR DEPOSITED FILM OF ORGANIC MATERIAL

This application is a continuation, of application Ser. No. 349,408, filed Feb. 16, 1982 now abandoned.

FIELD OF THE INVENTION

This invention relates to a method of forming a thin vapor-deposited film or layer of an organic material and, more particularly, to a method of continuously forming a thin vapor-deposited film or layer of a polymer suitable for a protective layer.

BACKGROUND OF THE INVENTION

Organic materials such as high molecular weight materials or polymers are widely utilized as protective materials for various kinds of thin layers formed by vacuum vapor deposition. These organic materials are useful because of their excellent properties such as moisture resistance, durability, chemical resistance, insulating property, etc. In conventional techniques, these organic protective materials are formed on materials to be protected by coating, spraying, dipping, etc., e.g., as described in detail in *Coating Technology (Kohtingu Kohgaku)*, published by Asakura Book Store, pages 253 to 277 (Mar. 20, 1971). Although these methods are suitable for the formation of a relatively thick protective layer, it is difficult to form a uniform thin layer having a thickness of less than, for example, 1 $\mu$m conventional methods.

Recently, with the progress of thin metal layer-type magnetic recording media for the purpose of high-density recording, a very thin organic protective layer of about 50 to 1,000 Å thick has been required. A so-called vacuum thin layer method typified by vacuum evaporation coating can form a very thin uniform layer. Such a method is thought of as being useful for forming a protective layer suitable for the foregoing purpose.

In a vacuum deposition method, as referred to above, a desired thin vapor-deposited layer is formed on a support by evaporating a material under heat in a vacuum atmosphere. This method has, hitherto, been utilized on inorganic evaporation sources such as metals, etc., as well as some organic evaporation sources.

However, when evaporating a high molecular weight material such as an organic polymer, etc., by heating in vacuum, the high molecular weight material is decomposed or gasified before it is sufficiently evaporated. Accordingly, the material does not attach to the article to be vapor-deposited. Furthermore, even if the high molecular weight material is vapor-deposited on an article, it forms decomposition products or has a reduced molecular weight. Thus, it frequently forms a layer having different properties from those of the evaporation source material before evaporation. Accordingly, it is difficult to form a film or layer of the same material as the organic polymer before evaporation. In view of the above, it can be seen that there are problems in the practical use of vacuum evaporation coating for organic polymers.

The material vapor-deposited on an article to be vapor-deposited is not always same as a polymer used as the evaporation source. However, it is sometimes desirable that the material formed by the vapor deposition be different from the material used as the evaporation source. That is, it is desirable to form a thin organic film or layer having desired properties with good reproducibility, at low cost, and at a high speed. Therefore, it has been desired to continuously form a thin organic film or layer by vapor deposition with good reproducibility and at good efficiency. However, no suitable methods for forming such a layer have been found. For example, Japanese Patent Publication No. 17440/64 and GB No. 991840 disclose a method of forming a polymer film by evaporating an organic polymer as an evaporation source by irradiation with a high energy electron beam while maintaining the polymer at a temperature below its decomposition point.

However, in the foregoing method, a charge up phenomenon of the evaporation source material occurs due to the irradiation with the electron beam. Accordingly, difficulties such as discharging, etc., are very likely to occur, making it very difficult to continue stable vapor deposition for a long period of time. Also, it is very difficult to continue stable electron beam irradiation while preventing the decomposition of the evaporation source material and the reduction in vacuum due to the decomposition.

Japanese Patent Publication No. 45989/74 discloses a method of fusing a non-thermoplastic resin by heating and continuously extruding the fused resin onto the surface of a heated drum disposed in a vacuum atmosphere by means of a pump in order to attach the resin to the surface of the drum. A thin vapor-deposited layer of the resin is formed on a material to be vapor-deposited by evaporating the resin on the surface of the drum under heat. However, in this system, it is necessary to completely evaporate the organic polymer attached to the drum. Therefore, the selection of the temperature of the drum and the selection of the supplying amount of the organic polymer are very complicated. In particular, in the case of an organic polymer having a relatively high decomposing property, the unevaporated polymer remains on the drum if the temperature of the drum is too low. However, if the temperature of the drum is too high, a carbonized residue formed by the decomposition of the polymer accumulates on the surface of the drum. Since these materials remaining on the surface of the drum obstruct the heat conduction from the drum, it is difficult to continually perform stable vapor deposition for a long period of time.

Japanese Patent Publication No. 21907/78 discloses a method of vapor-depositing polyethylene and polypropylene by maintaining these polymers at the optimum evaporation temperature. However, this method cannot be applied widely due to the limited number of materials which can be vapor-deposited by this method.

On the other hand, as a vapor deposition method of an alloy composed of elements each having different vapor pressure or of a decomposable compound, a so-called flash vapor deposition method has been used. In the flash vapor deposition method, an evaporation source material is completely evaporated by continuously supplying the material, little by little, to a heat-evaporating section, which is preheated and maintained at a high temperature.

It is not impossible to apply the flash vapor deposition method to organic polymers. Unlike inorganic materials such as alloys, etc., an organic polymer is partially decomposed and carbonized if abruptly heated. The carbonized product accumulates as residue. Therefore, when using the flash vapor deposition method, it is difficult to evaporate an organic polymer with good reproducibility over a long period of time.

As described above, it is impossible to continuously vapor-deposit an organic polymer with good reproducibility over a long period of time in conventional vapor deposition methods. Accordingly, the development of new vapor deposition method is desired.

SUMMARY OF THE INVENTION

As the result of various investigations on improving a continuous vapor deposition method for forming a thin film or layer of an organic material such as an organic polymer, etc., the inventors have succeeded in attaining this invention.

That is, the invention has been made based on the fact that in order to stably form a vapor-deposited organic thin film or layer, with a good reproducibility, for a long period of time, it is necessary to continuously supply a vapor deposition source and carry out evaporation by heating in such a manner so as to maintain a constant heating condition over a long period of time.

An object of this invention is to provide a method of stably and continuously vapor-depositing an organic material with good reproducibility.

The present invention can be attained by a method of forming a vapor deposited organic thin film which comprises: continuously supplying a heat resisting support having previously attached thereto an organic evaporation source to a space between a material to be vapor-deposited and a heating means under a vacuum atmosphere; heating the support by a heating means in order to continuously evaporate the foregoing organic evaporation source from the heat resisting support; and form a vapor-deposited organic thin film of the material to be vapor-deposited.

DETAILED DESCRIPTION OF THE INVENTION

In accordance with the present invention, the heat-evaporating condition can be maintained constant since fresh organic evaporation source material is continually supplied under the same conditions. Thus, it is possible to form a vapor deposited organic thin film or layer with good reproducibility over a long period of time.

Furthermore, in accordance with the present invention, it is not always necessary to completely evaporate the organic evaporation source. The organic evaporation source material may remain on the support for supplying the evaporation source. More specifically, in accordance with the present invention, even by using an organic evaporation source material which is likely to decompose or be reduced in its molecular weight, a thin vapor-desposited film or layer of the organic material can be formed with good reproducibility.

Furthermore, according to this invention, if an optimum amount of an organic evaporation source material is previously formed on a support for supplying the evaporation source with a precise amount of coating, etc., stable vapor deposition can be performed. Accordingly, the properties of the vapor-deposited thin film or layer can be maintained constant.

The present invention will be explained in detail by referring to the embodiments shown in the accompanying drawings.

Figure 1:
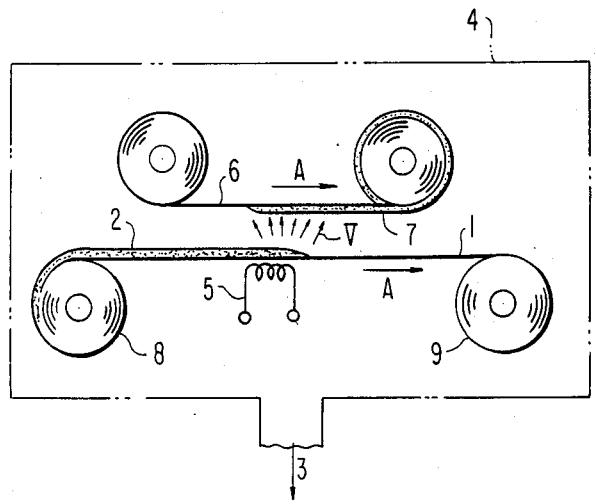
FIG. 1 is a schematic view showing an embodiment of this invention.
Figure 2:
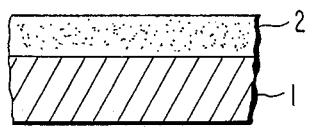
FIG. 2 is a sectional view showing the construction of evaporation source material of this invention.

As shown in FIG. 1 and FIG. 2, an organic evaporation source material 2 previously formed on a heat resisting support 1 is continuously supplied to a space between a heating means 5 and a material 6 to be vapor-deposited. The material 2 is deposited on material 6 while it is inside a casing 4 which is maintained at a proper reduced pressure of usually $10^{-2}$ to $10^{-6}$ Torr by means of an evacuation system 3. The organic evaporation source material 2 is heated by the heating means 5 to form a vapor stream V. The stream V contains vapor particles of the evaporation source material 2, which attach to the surface of material 6 to be vapor-deposited. The material 6 moves in the same direction A as the support 1, thereby a desired organic vapor-deposited layer 7 is formed on the support.

The support 1 which was previously wound round a delivery roll 8 is wound round a winding roll 9.

Because fresh organic evaporation source material 2 is supplied continuously to the heating means 5, it is possible to vapor-deposit the organic material at a constant rate under stable conditions for a long period of time.

In addition, the support 1 is desirably made of a heat resisting material, which is not fused or deteriorated at the evaporation temperature of the organic evaporation source material 2. The support 1 is in a form capable of stably holding thereon the organic evaporation source material 2. Also, the support 1 is preferably flexible since it is preferable to wind the support on roll 9. Examples of suitable supports include: a ribbon or brain composed of heat resistant fibers such as glass wool, etc.; metallic sheets; wire nettings; and films composed of a heat resistant resin. Such a support 1 may be discarded after use or may be reused after removing residue of the evaporation source material from the support.

Examples of useful organic evaporation source material 2 include any materials capable of being evaporated by heating and thereafter attaching to the surface of the material 6 as a layer or film 7. Also, the vapor-deposited film or layer 7 may have different properties from that of the evaporation source material 2. Specific examples of useful evaporation source materials 2 include: polyolefin such as polypropylene, polyisobutylene, polyisoprene, polybutadiene, etc., vinylic resins such as vinyl chloride resins, vinyl acetate resin, polyvinyl alcohol, etc., vinylidenic resins such as polyvinylidene chloride resin, etc., polyester such as alkyd resin, unsaturated polyester resin, maleic acid resin, etc., polycarbonate such as a reactant of bisphenol with diphenyl carbonate, i.e.,

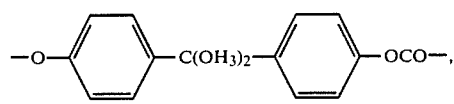

etc., polyamide such as 6-nylon, 6,6-nylon, etc., polyacrylonitrile, polyurethane, polyether, cellulose series resins, and the fluorine series resins such as polytetrafluoroethylene, polytrifluorochloroethylene, etc.

Useful organic polymers have a wide range of molecular weights. Optimum evaporation source material 2 can be selectively used to form a thin layer or film 7 having desired properties. In addition to the above-described polymers, organic compounds having relatively low molecular weights, such as higher fatty acids, etc., can be used. Examples of the higher fatty acids preferably include behenic acid, stearic acid, etc.

In accordance with the present invention, organometallic compounds, materials forming organic materials by decomposition, or a mixtures with nonevaporating materials can be used.

It is possible to use a variety of methods for forming the organic evaporation source material 2 on the support 1. Examples of such methods include coating the organic evaporation source material 2 on the support while it is in the form of a solution in an organic solvent. According to another method, a support composed of a fibrous material is impregnated with the evaporation source material dissolved in an organic solvent. In yet another method, the organic evaporation source material 2 may be directly attached to the support 1 after being fused by heating or may be attached under pressure by heating. In still another method, both materials (i.e., 1 and 2) are simply laminated to each other. The amount of the organic evaporation source material is selected considering the necessary film thickness and travelling speed of the vapor-deposited organic thin film or layer 7, the temperature of the heating means 5, and the travelling speed of the support. For example, the film thickness and travelling speed of the material to be vapor-deposited are preferably about 1 Å to 10 μm and about 1 cm to 200 m per minute, respectively, and the travelling speed of the evaporation source material is about 0.2 cm to 500 m per minute. Further, the temperature of the heating means is preferably about 50° to 1,000° C.

The support 1 having formed thereon the organic evaporation source material 2 may be placed in the vacuum casing 4 as a roll or bobbin thereof or may be supplied into the inside of the casing 4 from outside by a system known as a so-called air-to-air system.

A coating apparatus for the organic evaporation source material may be placed in outside the casing 4 at a point prior to the vacuum vapor deposition apparatus. Furthermore, a system may be employed wherein the foregoing support 1 and organic evaporation source material 2 are separately placed in the casing 4. The organic evaporation source material 2 is continuously supplied to the surface of the support 1 little by little, and after uniformly fusing and attaching it to the support by heating, the material 2 is supplied to the heating means 5 together with the support 1.

Examples of useful heating means 5 include electric resistance heating, electron beam heating, ultraviolet radiation heating, induction heating, and heating by directly passing electric current. The organic evaporation source material 2 may be heated from any side, such as through the support 1. It is necessary to maintain the heating temperature at a constant value and desirable for the temperature to be controlled by some means.

It is desirable to maintain a high degree of vacuum in casing 4. However, when using a material which is highly decomposable, the material may be vapor-deposited at a low degree of vacuum. Also, depending upon the circumstances, the degree of vacuum may be decreased by introducing an inert gas into the casing to increase uniformity. The degree of vacuum of about $10^{-2}$ to $10^{-6}$ Torr is usually practical.

The material 6 to be vapor-deposited is suitably a conveyable long film but may be in another form. Also, the material 6 may be a base material such as polyethylene terephthalate, etc., having formed thereon a vacuum vapor-deposited layer of a metal, etc. In this case, a vapor-deposited metal thin layer and a vapor-deposited organic thin layer may be continuously formed by a same apparatus. In the ferromagnetic recording media composed of a ferromagnetic metal thin layer, the improvements of the corrosion, strength for friction and running properties are usually desired. The magnetic recording media have relation of a high-speed relative motion to magnetic head during recording of magnetic signal, reproducing and erasing. Therefore, it is necessary to make running properties stable and smooth while at the same time preventing the friction between magnetic head and magnetic recording media or decomposition thereof. Furthermore, it is necessary to prevent the reduction or disappearance of a signal recorded which caused by a rust with the lapse of time during storage of magnetic recording media. In order to improve such durability and water-proofing properties, a use of protective layer has been studied. However, for example, in coating method, the protective layer is very thick, and as a result, spacing loss between magnetic head and magnetic recording layer is caused. In accordance with the present invention, since very thin organic protective layer is prepared, no spacing loss between magnetic head and magnetic recording layer is present, and as a result, the durability and water-proofing properties are improved.

Furthermore, to improve adhesion between the material 6 and a vapor-deposited organic thin layer, a pretreatment such as a glow discharging treatment, ion bombardment treatment, etc., may be applied to the material 6.

In accordance with the present invention, nearly any organic material can be used for continuously forming deposited thin films or layers. Accordingly, the practical value of the method of the present invention is very large.

Figure 3:
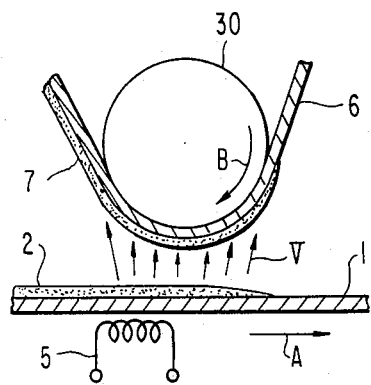
FIG. 3 is a schematic view showing a second embodiment of this invention.

FIG. 3 shows another embodiment of this invention showing different travelling direction and travelling means for the material 6. In FIG. 3, a rotatable cooling can 30 is disposed over the heating means 5. The can 30 supports the material 6 on the outer surface of its lower portion and moves the material 6 in a direction B opposite to the travelling direction A of a support 1 in FIG. 1. The material 6 is maintained in a bent state.

In addition, if necessary, a part of the outer surface of the lower portion of the cooling can 30 may be covered by a known mask. The mask prevents the attachment of vapor particles. Furthermore, the material 6 may be transported in the same direction as direction A of the support 1 in FIG. 1. The relative speed of the materials 1 and 6 may be changed, and the material 6 may be stopped for a definite period of time to perform vapor deposition at a fixed state.

Then, the invention is explained below in more detail by the following example and comparative example.

EXAMPLE 1

A SUS 316 strip 100 μm thick and 2 cm wide was coated with a polycarbonate resin using a solvent by a coil bar coating system at a thickness of about 15 μm. The coated strip provided a polycarbonate resin evaporation source material having a length of about 5 meters, which was wound in a roll form.

Using the vapor depositing apparatus as shown in FIG. 1, while transporting the evaporation source material in direction A at a speed of about 6 cm/min, the polycarbonate evaporation source was evaporated by radiation heating created by the resistance heating of a tungsten heater.

A polyethylene terephthalate film ½ inch wide and 25 μm thick having obliquely vapor-deposited cobalt layer of about 1,000 Å was positioned about 17 cm above the heat-evaporating portion parallel with the support. The film was transported in the same direction as the support at a speed of about 30 cm/min. Also, a film thickness meter of Crystal Oscillator system (Digital Thickness Monitor, Model DIM-200 of Sloan Technology Corp.) was disposed near the material to be vapor-deposited to monitor the vapor-deposited amount.

The temperature was selected such that the indication value on the film thickness monitor became 20 Å/sec (specific gravity was taken as 1). The degree of vacuum was $5 \times 10^{-4}$ Torr. By performing the vapor deposition for about 60 minutes under these conditions, a vapor-deposited organic thin layer (about 3 μg/cm$^2$) having a length of 20 meters was obtained. The vapor depositing speed was very stable over the entire length. Also, the vapor deposition was repeated again under the same conditions and the same vapor deposition speed was obtained under almost the same conditions.

When the vapor-deposited organic thin layer formed on the obliquely vapor-deposited cobalt layer was measured using FT-IR spectra, spectra readings near the polycarbonate composition prior to the vapor deposition were obtained over the whole length.

COMPARATIVE EXAMPLE 1

About 10 g of polycarbonate was placed in an ordinary tungsten resistance heating type boat (7 cm × 2 cm × 0.1 mm) and vapor deposition was performed while controlling the temperature of the boat in such a manner that the vapor evaporating speed became the same as above (20 Å/sec). When vapor evaporation was continued, the polycarbonate adjacent to the boat was carbonized and accumulated on the boat. This reduced the heat conduction from the boat, which resulted in increasing the electric current for heating the coating. Thus, after performing vapor deposition for a length material of about 20 meters, an electric current of about 1.5 times that used at the beginning of the vapor deposition was required.

Furthermore, in order to maintain a same vapor deposition speed, the temperature of the boat was manually controlled. However, since the deviation in temperature was large, stable control of the temperature was difficult. The same experiment was repeated again while only changing the vapor deposition speed. The heating conditions had to be changed a great deal in order to prevent the carbonization of vapor deposition material under heating.

When the vapor-deposited organic thin film obtained by the comparison method was analyzed by an FT-IR spectra, the FT-IR spectra of the deposited layer at the end of the vapor deposition differed from the FT-IR spectra at the beginning of the vapor deposition. In the initial vapor deposition, characteristic two high peaks (about 1,240 cm$^{-1}$ and about 1,770 cm$^{-1}$) of the polycarbonate were observed. However, the spectra of the deposited layer at the end of the vapor deposition were reduced to about 1/5 or less as compared with that at the beginning of the vapor deposition.

While the invention has been described in detail and with reference to specific embodiments thereof, it will be apparent to one skilled in the art that various changes and modifications can be made therein without departing from the spirit and scope thereof.

What is claimed is:

1. A process for forming a vapor-deposited organic thin film, comprising the steps of:
   continuously supplying fresh organic evaporation source material to a vapor-deposition zone by continuously transporting a fresh segment of a support base made of a heat resisting material and having an organic evaporation source material on a surface thereof through a vapor-deposition zone within an evaporation chamber;
   providing a second support base material within said evaporation chamber;
   providing a heating means with said evaporation chamber, in the vicinity of said support base having said organic evaporation source material thereon;
   heating said organic evaporation source material with said heating means to a temperature such that said organic evaporation source material forms a vapor; and vapor depositing said vapor on said second support base.

2. A process for forming a vapor-deposited organic thin film as claimed in claim 1, wherein both said support base having said organic evaporation source material thereon and said second support base are continuously transported through said vapor-deposition zone during said vapor deposition in a manner to continuously deposit said vapor on said second support base.

3. A process for forming a vapor-deposited organic thin film as claimed in claim 2, wherein said support base having said organic evaporation source material thereon is moved in the same direction as said second support base.

4. A process for forming a vapor-deposited organic thin film as claimed in claim 2, wherein said support base having said organic evaporation source material thereon is moved in a different direction than said second support base during said vacuum deposition.

5. A process for forming a vapor-deposited organic thin film as claimed in claim 1, wherein said vacuum chamber maintains a vacuum of about $10^{-2}$ to $10^{-6}$ Torr.

6. A process for forming a vapor-deposited organic thin film as claimed in claim 1, wherein said second support base is further comprised of a thin metal film vapor deposited thereon.

* * * * *